(12) United States Patent
Dietrich et al.

(10) Patent No.: US 9,114,990 B2
(45) Date of Patent: Aug. 25, 2015

(54) DEVICE AND METHOD FOR THE PRODUCTION OF SILICON BLOCKS

(75) Inventors: Marc Dietrich, Großschirma (DE); Mark Hollatz, Dresden (DE); Robert Zacharias, Freiberg (DE); Bernhard Freudenberg, Coburg (DE)

(73) Assignee: SolarWorld Innovations GmbH, Freiberg/Sachsen (DE)

( * ) Notice: Subject to any disclaimer, the term of this patent is extended or adjusted under 35 U.S.C. 154(b) by 1119 days.

(21) Appl. No.: 13/151,894

(22) Filed: Jun. 2, 2011

(65) Prior Publication Data

US 2011/0305622 A1 Dec. 15, 2011

(30) Foreign Application Priority Data

Jun. 15, 2010 (DE) .......................... 10 2010 030 124

(51) Int. Cl.
C30B 11/04 (2006.01)
C01B 33/02 (2006.01)
C30B 11/00 (2006.01)
C30B 29/06 (2006.01)

(52) U.S. Cl.
CPC .............. *C01B 33/02* (2013.01); *C30B 11/002* (2013.01); *C30B 11/003* (2013.01); *C30B 29/06* (2013.01)

(58) Field of Classification Search
USPC ........................................ 117/81, 82, 83, 932
See application file for complete search history.

(56) References Cited

U.S. PATENT DOCUMENTS

| 6,758,899 B2 * | 7/2004 | Hagi et al. ........................ 117/81 |
| 2007/0266931 A1 * | 11/2007 | Mueller et al. .................. 117/83 |
| 2008/0264207 A1 * | 10/2008 | Muller et al. .................... 75/392 |

FOREIGN PATENT DOCUMENTS

| DE | 3220338 A1 | 12/1983 |
| DE | 102005013410 | 9/2006 |
| DE | 102008051492 A1 | 4/2010 |
| JP | 55140800 A | 11/1980 |
| JP | 62288186 A | 12/1987 |
| JP | 4050189 A | 2/1992 |
| JP | 2000/327487 A | 11/2000 |
| WO | WO 2010/043350 A1 | 4/2010 |

* cited by examiner

*Primary Examiner* — Robert M Kunemund
(74) *Attorney, Agent, or Firm* — McGlew and Tuttle, P.C.

(57) ABSTRACT

A device for the production of silicon blocks comprises a vessel for receiving a silicon melt, the vessel comprising a vessel wall comprising at least one side wall and a bottom as well as an inside and an outside and a central longitudinal axis, and means for creating a temperature field on the inside of the bottom, the temperature field having a temperature gradient at the bottom of the vessel which is perpendicular to the central longitudinal axis at least in some regions when the silicon melt cools down for crystallization.

18 Claims, 4 Drawing Sheets

DEVICE AND METHOD FOR THE PRODUCTION OF SILICON BLOCKS

CROSS-REFERENCES TO RELATED APPLICATIONS

This application claims the priority of German Patent Application, Serial No. 10 2010 030 124.8, filed Jun. 15, 2010, pursuant to 35 U.S.C. 119(a), the content of which is incorporated herein by reference in its entirety as if fully set forth herein.

FIELD OF THE INVENTION

The invention relates to a device and a method for the production of silicon blocks and to silicon blocks produced according to this method.

BACKGROUND OF THE INVENTION

The production of large-volume silicon blocks is a key step in the production process of silicon solar cells. This method step has a decisive influence on the future properties of the semiconductor material, in particular on the achievable efficiency of the finished solar cells.

A device and a method for the production of silicon blocks is for example disclosed in JP 2000/327487 A.

There is however always the need to improve the controllability and reproducibility as well as the cost-effectiveness of such methods.

SUMMARY OF THE INVENTION

It is therefore an object of the invention to improve a device and a method for the production of silicon blocks. Furthermore, it is an object of the invention to provide silicon blocks having an improved structure.

These objects are achieved by a device for the production of silicon blocks, the device comprising a vessel for receiving a silicon melt, the vessel comprising a vessel wall comprising at least one side wall and a bottom as well as an inside and, an outside, and a central longitudinal axis, and a means for creating a temperature field on the inside of the bottom which temperature field has a temperature gradient which temperature gradient, when the silicon melt cools down, is perpendicular to the central longitudinal axis at least in some regions of the bottom of the vessel.

These objects are further achieved by a method for the production of silicon blocks, the method comprising the following steps of providing a device comprising vessel for receiving a silicon melt, with the vessel comprising a vessel wall having a bottom, and providing a silicon melt in the vessel, creating an inhomogeneous temperature field at the bottom of the vessel when the silicon melt crystallizes.

These objects are further achieved by a silicon block produced in accordance with the method according to the invention, which silicon block has a predetermined grain size distribution and grain orientation distribution at least one a side which has crystallized first.

The gist of the invention is to influence the crystallization of a silicon melt in a targeted manner by defining a temperature gradient at the bottom of a coquille.

It has been found according to the invention that it is possible to create a temperature gradient at the bottom of the coquille by means of a lateral heat flow which fosters the development of long, uniformly oriented dendrites. This was achieved by a unidirectional temperature gradient. This was surprising as an inhomogeneous temperature field at the bottom of the coquille is usually avoided in the crystallization of a silicon melt to prevent the phase boundary from being negatively affected.

The dendrites forming at the bottom of the coquille allow the further crystal development in the silicon melt to be influenced in a simple manner. In particular the structural features of the crystallized silicon blocks can be controlled in a simple manner. In particular the distribution of grain sizes and grain orientations as well as the shape of the grains and grain boundary structures can be influenced in a reproducible manner. It is therefore possible to produce silicon blocks having a predefined grain size distribution and grain orientation distribution.

A temperature field with a predefined temperature gradient at the coquille bottom is achievable in a simple manner by providing the bottom with at least two regions having different heat conductivities. There may be provided at least two, in particular multiple, in particular at least three, in particular at least four discrete regions having in each case a constant heat conductivity which for any two regions is pairwise different. Alternatively, the bottom may have a constantly varying, in particular a linearly increasing/decreasing heat conductivity. Likewise, a temperature gradient is achievable by providing the side wall with regions of different heat conductivity.

In an advantageous embodiment, the bottom comprises portions of at least two different materials, with the proportion of the individual materials varying at the thickness of the bottom in the direction perpendicular to the central longitudinal axis. The materials in particular have different heat conductivities. They may have a different chemical composition. In another embodiment, they may also be chemically homogeneous but have different physical properties in particular in terms of density, crystal structure or orientation. The bottom may in particular consist of regions of different materials across its entire thickness. In this case, the bottom comprises discrete adjacent regions of different materials. The bottom can have a constant thickness throughout. It can in particular have a plane inside. It is conceivable as well for the bottom to be formed of multiple layers, with the contribution of one layer to the total thickness of the bottom increasing/decreasing continuously, in particular linearly, across the extension of the bottom in the direction perpendicular to the central longitudinal axis. Instead of or in addition to the bottom, it is conceivable as well to provide a side wall which consists of at least two different materials.

The bottom may also comprise at least two regions of different thickness which is another simple manner of obtaining a temperature gradient at the bottom of the coquille. Instead of or in addition to providing a bottom with a locally varying thickness, it is conceivable as well to design the side wall in such a way as to have a locally varying thickness. A locally varying thickness can be produced in a simple manner by additional reinforcements or recesses, in particular blind holes.

Advantageously, the device comprises an insulation unit for insulating the vessel. The insulation unit comprises at least one bottom insulation element. Alternatively or additionally, the insulation unit comprises at least one side insulation element. It has been found according to the invention that arranging a suitable insulation unit allows the temperature field on the inside of the bottom of the vessel to be influenced in a targeted manner.

Bottom insulation elements comprising regions of different heat conductivity allow the temperature field on the inside of the vessel bottom to be influenced in a particularly effective manner.

Influencing the temperature field at the bottom of the vessel in a targeted manner is also possible using side insulation elements having regions of different heat conductivity. Regions of different heat conductivities in the insulation elements may be achieved by reinforcements, recesses, in particular bores or different insulation materials. The term "different materials" again refers to materials which differ in terms of their chemical composition or their physical properties. The insulating effect of the insulation elements can also be influenced by their arrangement relative to the vessel, in particular by their distance to the vessel.

Preferably at least one of the insulation elements is displaceable relative to the coquille. This is a simple manner of influencing the inhomogeneity of the temperature field. A displaceable insulation element in particular allows one to influence the starting point of the silicon melt crystallization in the coquille by an inhomogeneous temperature field before creating a homogeneous temperature field inside the coquille in the further crystallization progress. In other words, it is thus possible to influence the development of crystallization nuclei at the bottom of the coquille in a targeted manner while providing homogeneous, in particular isotropic conditions for the further crystal growth in the coquille.

Furthermore, the bottom of the coquille may be provided with an active temperature control unit for creating the inhomogeneous temperature field. An active temperature control unit refers to a device which, when activated, allows the heat flow into/out of the coquille to be controlled. This may for example be performed by means of a heating element or a cooling element which allows for an active heat transfer. The heating element is selected from at least one bottom heating element and at least one side heating element. The cooling element is selected from at least one bottom cooling element and at least one side cooling element. Advantageously, there may be provided several temperature control elements of this type. The temperature field in the coquille can be influenced in a more targeted and precise manner by means of several temperature control elements which are controllable independently of each other.

A displaceability of the at least one temperature control element is a simple manner of influencing the heat transport into/out of the coquille which is achievable by means of the active temperature control unit.

The method according to the invention allows silicon blocks having a predefined structure to be produced in a simple and reproducible manner.

The silicon blocks produced according to this method have corresponding advantages.

Further advantages and details of the invention will become apparent from the description of several embodiments by means of the drawing.

DESCRIPTION OF THE PREFERRED EMBODIMENTS

Figure 1:
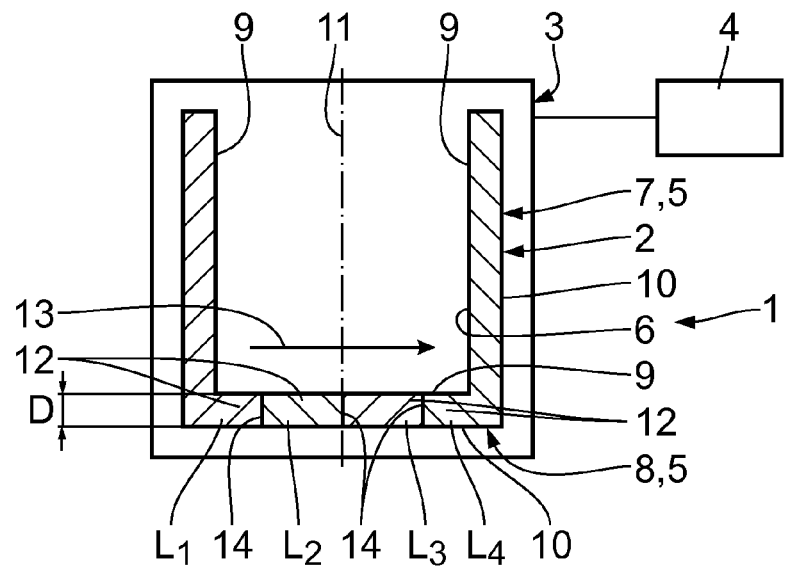
FIG. 1 shows a schematic cross-section through a device according to the invention according to a first embodiment.

The following is a description of a first embodiment of the invention with reference to FIG. 1. A device 1 for the production of silicon blocks comprises a coquille in the form of a vessel 2 for receiving a silicon melt. The coquille 2 is arranged in a furnace which is generally referred to as process chamber 3. The furnace 3 is not necessarily used exclusively for heating. It may also be used for in particular controlled cooling of its interior. In order to control the temperature, in particular the temperature field, in the furnace 3, the furnace comprises a first temperature control unit 4 which is only schematically shown in FIG. 1. Details concerning the design of the furnace 3 and of the temperature control unit 4 can be found in DE 10 2005 013 410 A1, for example. The temperature control unit 4 may in particular comprise one or several heating elements as well as one or several cooling elements. These elements may be arranged in particular in the furnace 3 around the vessel 2, in particular below, next to or above the vessel 2.

The coquille 2 substantially has the shape of a cuboid which is upwardly open. The coquille 2 therefore has a rectangular, in particular a square cross-section. A cylindrical coquille having a round cross-section is however conceivable as well.

The coquille 2 has a base body 5 in the form of a vessel wall which may be provided at least with a partial coating 6, in particular an all-over coating in particular on its inside. The vessel wall 5 comprises at least one, in particular four side walls 7 and a bottom 8. These walls have in each case an inside 9 and an outside 10. The coquille 2 has a central longitudinal axis 11. The bottom 8 is transverse, in particular perpendicular, to the central longitudinal axis 11.

The vessel wall 5 may comprise components of a selection of quartz, graphite and ceramics, in particular on the basis of silicon dioxide, silicon nitride, silicon oxynitride or silicon carbide.

According to the embodiment shown in FIG. 1, the bottom 8 comprises several abutting regions 12 having different heat conductivities L. The regions 12 extend in each case from the inside 9 of the bottom 8 to the outside 10 thereof. In the direction perpendicular to the central longitudinal axis 11, the regions 12 have an increasing heat conductivity $L_i$, $L_1<L_2<L_3<L_4$. In the embodiment shown in FIG. 1, the side wall 7 shown on the right has the heat conductivity $L_4$ while the side wall 7 on the left has the heat conductivity $L_1$. It is however conceivable as well to provide side walls 7 having a uniform heat conductivity L.

Generally speaking, the bottom 8 comprises at least two regions 12 having a different heat conductivity $L_1$, $L_2$.

The regions 12 of different heat conductivity $L_i$ are a means to create a temperature field on the inside 9 of the bottom 8 which has a temperature gradient 13 at least in some regions for crystallization of the melt when the melt in the coquille 2 cools down, the temperature gradient 13 being perpendicular to the central longitudinal axis 11. The temperature gradient 13 is in particular parallel to the inside 9 of the bottom 8. It is in particular perpendicular to the boundary surfaces 14. In the Figures, the temperature gradient is in each case represented by an arrow which points in the direction of decreasing temperature. The temperature gradient 13 is in particular unidirectional.

The temperature gradient 13 developing on the inside of the bottom 8 when the melt in the coquille 2 cools down has a positive maximum value which amounts to at least 0.1 K/cm, in particular at least 0.5 K/cm, in particular at least 1 K/cm.

The regions 12 abut against each other at boundaries 14. According to the embodiment shown in FIG. 1, the boundaries 14 are perpendicular to the inside 9 of the bottom 8. The boundaries 14 are parallel to the central longitudinal axis 11. The different regions 12 therefore have a cuboid shape. Alternative shapes of the regions 12 are however conceivable as well.

The different heat conductivity $L_i$ of the regions may be achieved by selecting suitable materials. In other words, the bottom 8 has different materials in the different regions 12. "Different materials" means that the materials differ in terms of their chemical composition and/or in terms of their physical properties, in particular their density. Different densities may for example be achieved by suitably sintering a ceramic base material.

Generally speaking, the bottom 8 comprises at least two different materials which have a varying contribution to a thickness D of the bottom 8 in the direction perpendicular to the central longitudinal axis 11. The thickness D of the bottom 8 may be constant in particular across the entire extension of the bottom 8 in the direction perpendicular to the central longitudinal axis 11.

According to the embodiment shown in FIG. 1, the bottom 8 has the same composition in each region 12 across the entire thickness D thereof. The contributions of the different materials to the thickness D of the bottom 8 vary in discrete steps in the region of the boundaries 14.

Figure 2:
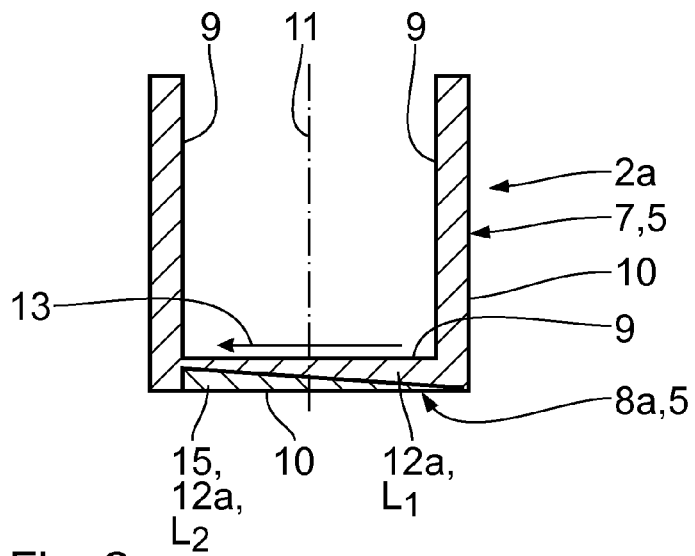
FIGS. 2 to 11 show schematic partial illustrations of further embodiments.

The following is a description, with reference to FIG. 2, of another embodiment of the invention. Identical parts are denoted by the same reference numerals as in the first embodiment to the description of which reference is made. Differently designed parts having the same function are denoted by the same reference numerals with an a added to them.

The bottom 8a of the coquille 2a shown in FIG. 2 comprises two different materials of different heat conductivity $L_1$, $L_2$, in particular $L_1 < L_2$, whose contribution to the thickness D of the bottom 8a increases or decreases continuously, in particular linearly in the direction perpendicular to the central longitudinal axis 11. The bottom 8a in particular has a wedge-shaped insert 15, with the heat conductivity $L_2$ of the wedge-shaped insert 15 differing from the heat conductivity $L_1$ in the remaining region 12a of the bottom 8a. The heat conductivities of the regions 12a differ in particular by at least 5%, in particular by at least 10%, in particular by at least 20%. The different heat conductivities of the regions 12a cause a temperature gradient 13 to develop on the inside of the bottom 8 when the melt in the coquille 2 cools down, the temperature gradient 13 amounting to at least 0.1 K/cm perpendicular to the central longitudinal axis 11.

According to the embodiment shown in FIG. 2, the bottom 8a comprises two layers. There may however also be provided more, in particular three, four or even more layers in the bottom 8a. What is important is that at least one layer has a varying thickness, in particular in the shape of a wedge, in the direction perpendicular to the central longitudinal axis 11.

As an alternative to the embodiment shown in FIG. 2, it is conceivable as well to produce the entire bottom 8a from a uniform material but with a varying thickness D. This also results in a heat conductivity L of the bottom 8a which differs from region to region.

Figure 3:
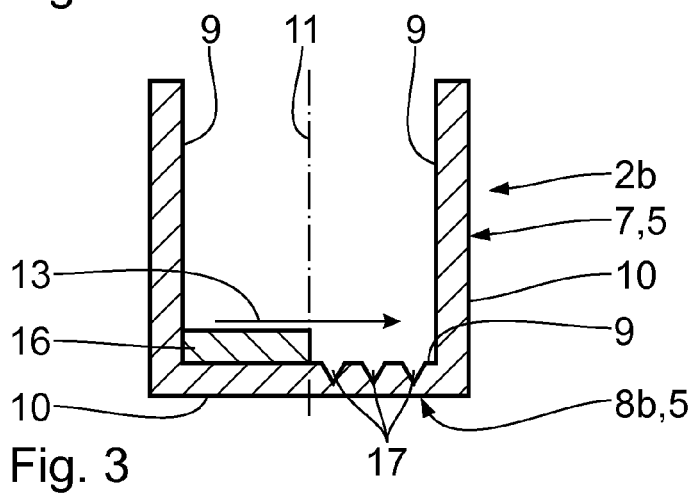

The following is a description, with reference to FIG. 3, of other embodiments of the invention. Identical parts are denoted by the same reference numerals as in the first embodiment to the description of which reference is made. Differently designed parts having the same function are denoted by the same reference numerals with a b added to them.

According to the embodiment shown in FIG. 3, the bottom 8b of the coquille 2b has regions of different thickness D. The thickness D may in particular be reinforced by an additional layer 16 as shown by way of example on the left of FIG. 3. The additional layer 16 may consist of the same material as the rest of the bottom 8a. It may also consist of a different material. It may be arranged on the inside 9 or on the outside 10 of the bottom 8b. As an alternative or in addition to a reinforcement of the bottom 8b, the bottom 8b may have a locally reduced thickness D which is obtained by one or several recesses 17 as shown on the right of FIG. 3. The recesses may also be in the form of grooves 17. These grooves 17 are located on the inside or outside of the bottom 8b and run preferably across the entire coquille bottom 8b whose thickness D is to be reduced. The recesses 17 are in particular in the form of blind holes. They may also be funnel-shaped.

Generally speaking, the bottom 8b has a variable cross-section. A variable cross-section is provided if the bottom 8b has different cross-sections in at least two planes which are parallel to each other and to the central longitudinal axis 11. The insulation capability of the bottom 8b can be increased by reinforcing the thickness D thereof and reduced by reducing the thickness D thereof.

The thickness D of the bottom 8b may vary in discrete steps or continuously, in particular linearly.

Figure 4:
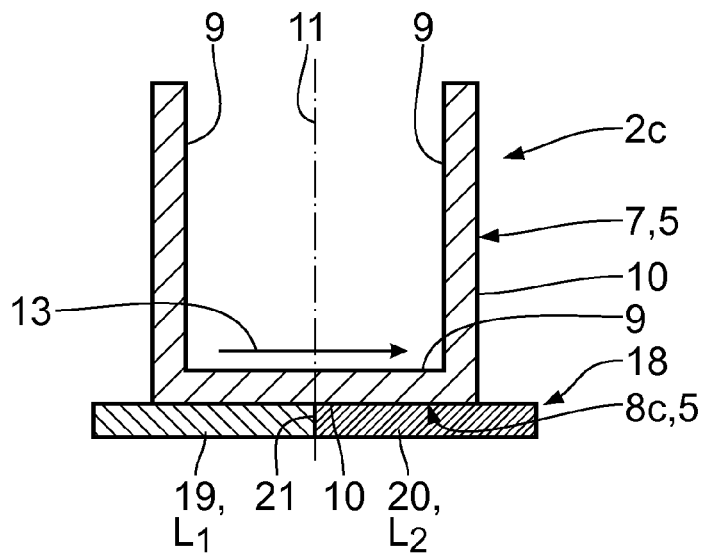

The following is a description, with reference to FIG. 4, of another embodiment of the invention. Identical parts are denoted by the same reference numerals as in the first embodiment to the description of which reference is made. Differently designed parts having the same function are denoted by the same reference numerals with a c added to them.

According to the embodiment shown in FIG. 4, there is provided an insulation unit 18 comprising two bottom insulation elements. There may also be provided more than two bottom insulation elements 19, 20. The bottom insulation elements 19, 20 are in direct contact with the outside 10 of the bottom 8c of the coquille 2c. They have at least locally different heat conductivities $L_1$, $L_2$, in particular $L_1 < L_2$. Corresponding to the embodiments described above, this may be achieved by different materials. The bottom insulation element 19 may for example consist of hard felt while the bottom insulation element 20 consists of graphite. Other materials are conceivable as well. However, they preferably consist of a high-temperature resistant material. A suitable high-temperature resistant material is resistant to temperatures up to at least 1000° C., in particular at least 1500° C.

It is of course conceivable as well to produce the bottom insulation elements 19, 20 from the same material but with a different thickness. The heat conductivity of the bottom insulation elements 19, 20 may also be influenced by a defined structuring. If the bottom insulation elements 19, 20 consist of graphite, the bottom insulation elements 19, 20 may in particular have a different orientation of the crystal structure. This allows the heat conductivity of the bottom insulation elements 19, 20 to be influenced. On the other hand, if hard felt is used, the heat conductivity of the bottom insulation elements 19, 20 can be influenced by their density. The bottom insulation elements 19, 20 may furthermore be provided with recesses or openings.

Generally speaking, the insulation unit 18 comprises at least two regions of different heat conductivity $L_1$, $L_2$, in particular $L_1 < L_2$. The insulation unit 18 with the regions of different heat conductivity serves as a means to create the inhomogeneous temperature field on the inside 9 of the bottom 8, the temperature field having at least a local temperature gradient 13 running perpendicular to the central longitudinal axis 11 when the melt in the coquille 2 cools down for crystallization.

In the embodiment shown in FIG. 4, the bottom insulation elements 19, 20 abut against each other at a plane boundary surface 21 running through the central longitudinal axis 11. It is conceivable as well to provide the bottom insulation elements 19, 20 with a boundary surface which is perpendicular to the central longitudinal axis corresponding to the bottom 8a according to the embodiment shown in FIG. 2.

The bottom insulation elements 19, 20 protrude beyond the bottom 8c of the coquille 2c in the direction perpendicular to the central longitudinal axis 11. It may however also be provided for the bottom insulation elements 19, 20 to be flush with the bottom 8c or to arrange one or several bottom insulation elements 19, 20 only in a partial region of the bottom 8c. The bottom insulation elements 19, 20 may be provided in addition to a base plate which is not shown in FIG. 4. In this case, they are arranged in particular on the base plate. Alternatively, the bottom insulation elements 19, 20 may be provided in the base plate.

Figure 5:
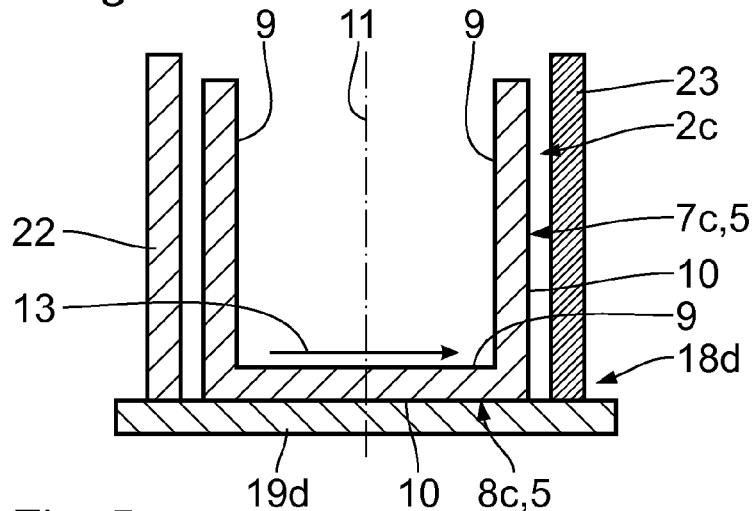

The following is a description, with reference to FIG. 5, of another embodiment of the invention. Identical parts are denoted by the same reference numerals as in the first embodiment to the description of which reference is made. Differently designed parts having the same function are denoted by the same reference numerals with a d added to them. According to the embodiment shown in FIG. 5, the insulation unit 18d comprises two side insulation elements 22, 23 in addition to the bottom insulation element 19d. The bottom insulation element 19d may be the base plate described above.

The side insulation elements 22, 23 are arranged parallel to the side walls 7c of the coquille 2c. They are arranged at a distance from the side walls 7c. They may however also be arranged in such a way as to be in direct contact with the side walls 7c. A bottom end of each of the side insulation elements 22, 23 abuts against the bottom insulation element 19d. At their opposite ends, they in each case protrude beyond the side wall 7c in the direction of the central longitudinal axis 11. In other words, they have an extension in the direction of the central longitudinal axis 11 which is at least equal to, in particular greater than that of the side walls 7c.

It is however conceivable as well to provide side insulation elements 22, 23 having a smaller extension in the direction of the central longitudinal axis 11 than the side walls 7c. It may in particular be advantageous to arrange one of the side insulation elements 22, 23 only in the region remote from the bottom 8c, in other words in the upper region of the side wall 7c. This allows one to further influence, in particular increase the lateral heat flow in the bottom region of the side wall 7c.

The side insulation elements 22, 23 have different heat conductivities L. Details concerning the design of the side insulation elements 22, 23 can be found in the above description of the bottom insulation elements 19, 20.

It is conceivable to form the side insulation elements 22, 23 in each case in one piece with one of the bottom insulation elements 19, 20.

Figure 6:
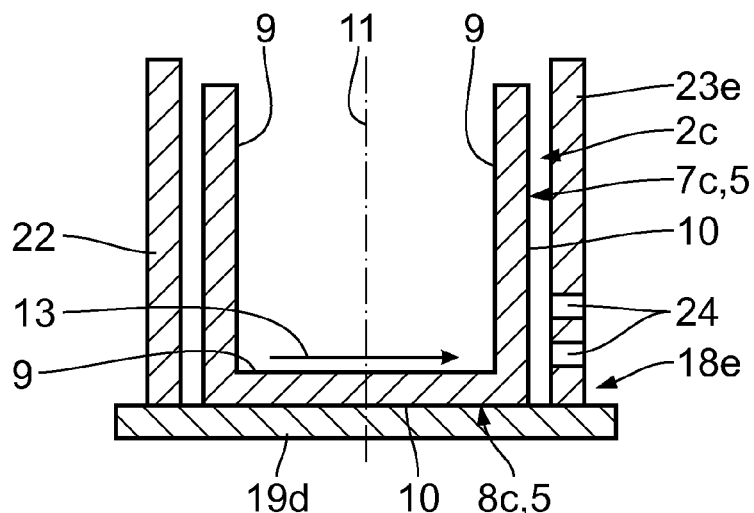

The following is a description, with reference to FIG. 6, of another embodiment of the invention. Identical parts are denoted by the same reference numerals as in the first embodiment to the description of which reference is made. Differently designed parts having the same function are denoted by the same reference numerals with an e added to them.

According to the embodiment shown in FIG. 6, the side insulation element 23e has several openings 24. It has at least one, in particular at least two, in particular at least three, in particular at least five openings 24. The openings result in a higher lateral heat dissipation compared to the regions of the side insulation element 23e without openings. The openings may be bore holes having a circular cross-section. They are preferably arranged in the side insulation element 23e in such a way as to be on the same level and parallel to the bottom 8c of the coquille 2c. Alternatively, two or more rows of openings 24 may be arranged one above the other.

The temperature gradient 13 perpendicular to the central longitudinal axis 11 may also be increased by producing the side insulation element 22 from a material having a lower heat conductivity $L_i$ than the side insulation element 23.

It is conceivable as well to provide an opening 24 in the shape of an oblong hole in the side insulation element 23e. In this case, the oblong opening 24 is preferably parallel to the bottom 8c.

In a particularly advantageous embodiment, the openings 24 may be closable.

Corresponding openings 24 may also be provided in the bottom insulation elements 19, 20.

Figure 7:
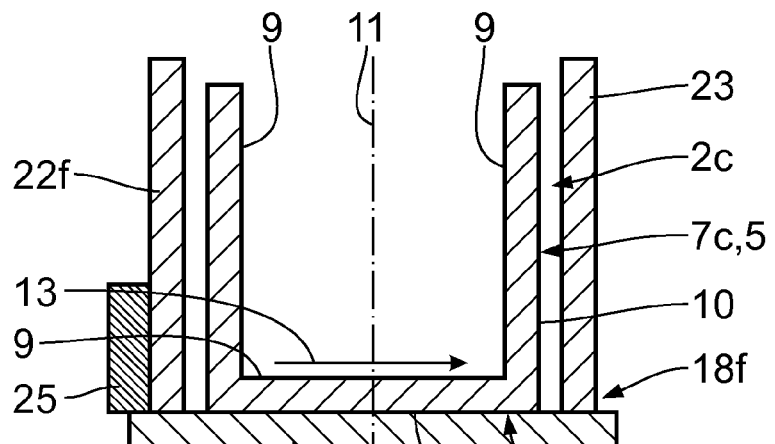

The following is a description, with reference to FIG. 7, of another embodiment of the invention. Identical parts are denoted by the same reference numerals as in the first embodiment to the description of which reference is made. Differently designed parts having the same function are denoted by the same reference numerals with an f added to them.

According to the embodiment shown in FIG. 7, the side insulation element 22f has an additional insulation element 25.

The additional insulation element 25 is arranged in the bottom region of the side insulation element 22f. It is a component of the side insulation element 22f. It has an extension in the direction of the central longitudinal axis 11 which is smaller than the extension of the side wall 7c in this direction. The extension of the additional insulation element 25 in the direction of the central longitudinal axis 11 is in particular in the range of 5 cm to 50 cm, in particular in the range of 10 cm to 30 cm.

Figure 8:
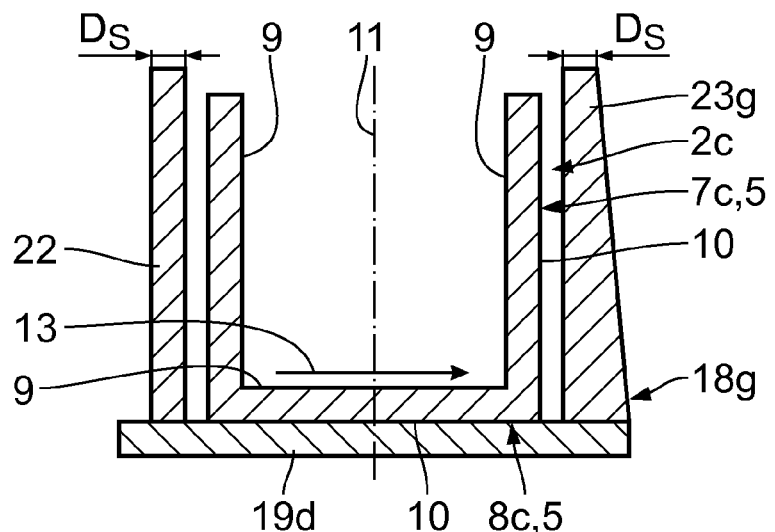

The following is a description, with reference to FIG. 8, of another embodiment of the invention. Identical parts are denoted by the same reference numerals as in the first embodiment to the description of which reference is made. Differently designed parts having the same function are denoted by the same reference numerals with a g added to them.

According to the embodiment shown in FIG. 8, the side insulation element 23g has a thickness in the di reaction perpendicular to the central longitudinal axis 11 which linearly decreases with increasing distance from the bottom 8c of the coquille 2c. The insulating effect of the side insulation element 23g therefore decreases with increasing distance from the bottom 8c of the coquille 2c. At its end remote from the bottom 8c, the side insulation element 23g has a thickness $D_S$ which is just equal to a thickness $D_S$ of the side insulation element 22 on the side which is opposite thereto relative to the central longitudinal axis 11. On the side of the side insulation element 23g whose thickness increases towards the bottom 8c, the temperatures at the bottom 8c of the coquille 2c are higher than on the opposite side of the bottom 8c when the silicon melt cools down for crystallization. The side insulation elements 23g, 22 thus serve as means for creating an inhomogeneous temperature field on the inside 6 of the bottom 8c. The inhomogeneous temperature field reduces across the height of the continuously decreasing thickness $D_S$ of the side insulation element 23g. This allows the positive effect of the temperature gradient 13 in the direction perpendicular to the central longitudinal axis 11 to be focused on the bottom region 8c of the coquille 2c but still be maintained in the direction of the central longitudinal axis 11.

Figure 9:
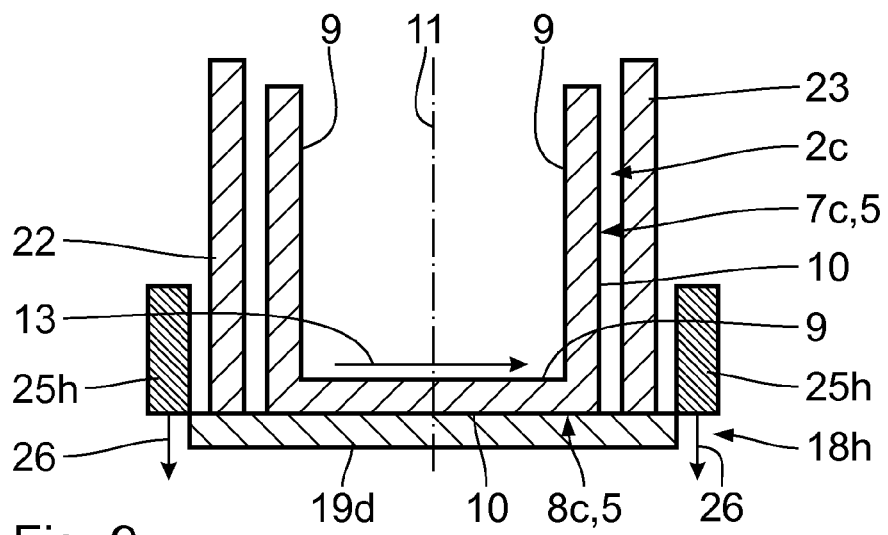

The following is a description, with reference to FIG. 9, of another embodiment of the invention. Identical parts are denoted by the same reference numerals as in the first embodiment to the description of which reference is made. Differently designed parts having the same function are denoted by the same reference numerals with an h added to them. In the embodiment shown in FIG. 9, there are provided two additional insulation elements 25h. The additional insulation elements 25h are spaced from the side insulation elements 22, 23 when seen in the direction perpendicular to the central longitudinal axis 11. They may also abut against the side insulation elements 22, 23. In this case, the bottom insulation element 19d advantageously does not protrude beyond the bottom 8c of the coquille 2c in the direction perpendicular to the central longitudinal axis 11. The additional insulation elements 25h are displaceable parallel to the central longitudinal axis 11 in a direction of displacement 26.

Generally speaking, at least one of the additional insulation elements 25h is displaceable relative to the coquille 2. Displacement may take place in a direction parallel or perpendicular to the central longitudinal axis 11. It is possible as well for the additional insulation elements 25h to be pivoted in particular about a pivot axis which is parallel to the respective side wall 7c.

Generally speaking, the insulation units 18, 18d to 18h are asymmetric in such a way that the lateral heat dissipation from the coquille 2c in the region of the bottom 8c is different on sides of the bottom 8c which are opposite to each other. They are therefore means for creating an inhomogeneous temperature field on the inside 9 of the bottom 8 which temperature field has a temperature gradient 13 which is perpendicular to the central longitudinal axis 11 at least in some regions when the melt in the coquille 2 cools down for crystallization.

Figure 10:
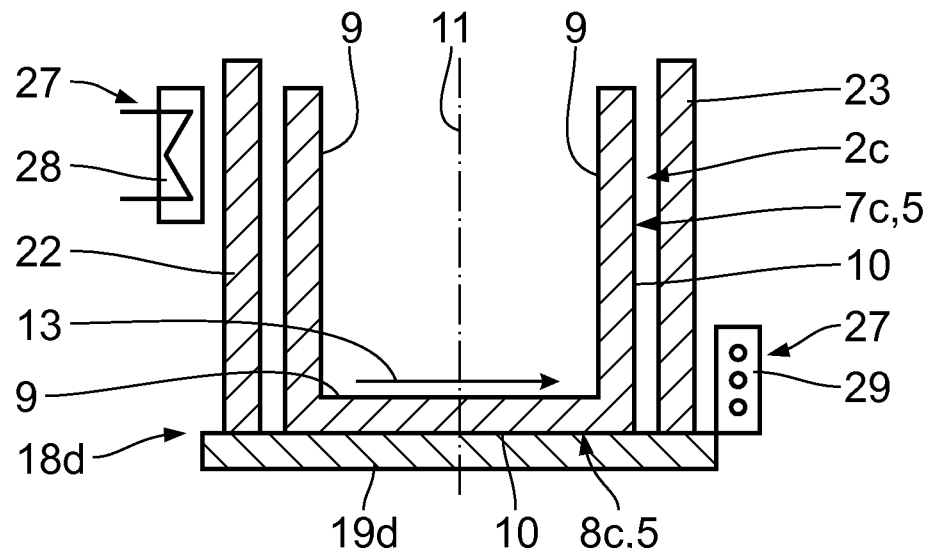

The following is a description, with reference to FIG. 10, of another embodiment of the invention. Identical parts are denoted by the same reference numerals as in the first embodiment to the description of which reference is made. According to the embodiment shown in FIG. 10, there is provided an active temperature control unit 27 for creating the inhomogeneous temperature at the bottom 8c of the coquille 2c. The temperature control unit 27 is in particular a second temperature control unit 27 which is provided in addition to the first temperature control unit 4 and which is controllable independently thereof. The temperature control unit 27 comprises at least one temperature control element. The at least one temperature control element is selected from a heating element 28 and a cooling element 29.

The heating element 28 is again selected from at least one bottom heating element and at least one side heating element. There may in particular also be provided several heating elements 28 which are preferably controllable independently of each other.

Accordingly, the cooling element 29 is selected from at least one bottom cooling element and at least one side cooling element. There may in particular be provided several cooling elements 29 which are preferably controllable independently of each other.

The heating element 28, which is a side heating element, is arranged at a distance from the side wall 7c. It is in particular arranged on the side of the side insulation element 22 which is opposite to the side wall 7c.

The cooling element 29, which is a side cooling element, is arranged at a distance from the side wall 7c. It is in particular arranged on the side of the side insulation element 23 which is opposite to the side wall 7c.

The heating element 28 is arranged on the side of the coquille 2 opposite to the cooling element 29.

According to the embodiment shown in FIG. 10, the temperature control unit 27 comprises both the heating element 28 and the cooling element 29. It is however conceivable as well to dispense with one of the elements 28, 29. In this case, the temperature control unit 27 comprises exclusively one or several heating elements 28 or one or several cooling elements 29.

The side temperature control elements preferably have an extension in the direction of the central longitudinal axis 11 in the range of 10% to 120%, in particular in the range of 10% to 30%, or in the range of 80% to 120% of the extension of the side walls 7c in the direction of the central longitudinal axis 11.

At least one, in particular several, in particular each of the temperature control elements 28, 29 may be designed in such a way as to be displaceable relative to the coquille 2c. They may in particular be arranged in such a way as to be displaceable in the direction parallel or perpendicular to the central longitudinal axis 11. They may also be pivotable about a pivot axis which is in particular parallel to one of the side walls 7c.

Figure 11:
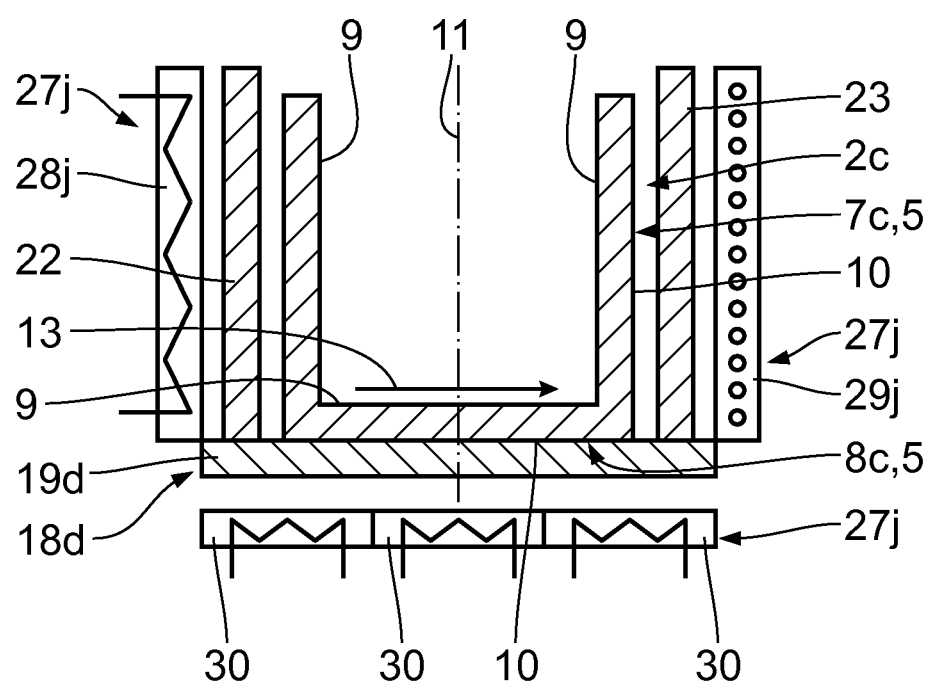

The following is a description, with reference to FIG. 11, of another embodiment of the invention. Identical parts are denoted by the same reference numerals as in the first embodiment to the description of which reference is made. Differently designed parts having the same function are denoted by the same reference numerals with a j added to them. According to the embodiment shown in FIG. 11, the temperature control unit 27j comprises both a side heating element 28j and a side cooling element 29j. Furthermore, the temperature control unit 27j comprises several bottom heating elements 30.

As in the embodiment according to FIG. 10, the side heating element 28j and the side cooling element 29j are arranged on opposite sides of the coquille 2c.

The bottom heating elements 30 are arranged at a distance from the bottom 8c of the coquille 2c. They are arranged on the side of the bottom insulation element 19d of the insulation unit 18d which is opposite to the bottom 8c. The bottom heating elements 30 are controllable independently of each other. Likewise, the side heating element 28j and the side cooling element 29j may also be divided in several segments which are controllable independently of each other.

As an alternative to the bottom heating elements 30, there may be provided bottom cooling elements as well.

The features of the embodiments according to FIGS. 1 to 11 may of course also be combined with each other. In particular the inventive design of the coquille 2, 2a, 2b according to one of the embodiments shown in FIGS. 1 to 3, the design of the insulation unit 18, 18d to 18h according to one of the embodiments shown in FIGS. 4 to 9 and the design of the temperature control unit 27, 27j according to one of the embodiments shown in FIGS. 10 and 11 may be randomly combined with each other. For example, it may be particularly advantageous to combine an embodiment in which the bottom 8, 8a, 8b of the coquille 2, 2a, 2b has at two least regions of different heat conductivity $L_i$ with an insulation unit 18 comprising several different bottom insulation elements 19, 20 and/or a temperature control unit 27, 27j, in particular with several bottom heating elements 30.

The following is a description of the method according to the invention for producing silicon blocks. The device 1 comprising the coquille 2 for receiving the silicon melt is provided in a first step. Then the silicon melt is provided in the coquille 2. It is conceivable to fill the silicon melt into the coquille 2 when the silicon melt has already liquefied. The silicon melt may however also be molten in the coquille 2 in the furnace 3. In order to crystallize the silicon melt in the coquille 2, an inhomogeneous temperature field is created at the bottom 8 of the coquille. The temperature field in particular has a temperature gradient 13. The temperature gradient 13 at the bottom 8 of the coquille 2 causes directed dendrites to form at the bottom 8 of the coquille 2. Adapting the temperature gradient 13 to the geometric details and thermal properties of the coquille 2, in particular the heat conductivity thereof, in a suitable manner allows particularly long directed dendrites to form at the bottom 8 of the coquille 2.

The method according to the invention in particular allows at least 10%, in particular at least 30%, in particular at least 50% of the dendrites forming at the bottom 8 of the coquille 2 to have a length of at least 25%, in particular at least 50%, in particular at least 75% of the entire extension of the bottom 8 in the direction of the temperature gradient 13, in other words in particular in the direction perpendicular to the central longitudinal axis 11.

The dendrites have a preferred orientation corresponding to the direction of the temperature gradient 13. This means that at least 10%, in particular at least 30%, in particular at least 50% of the dendrites forming have an angle of less than 45°, in particular less than 30°, in particular less than 15° with the direction of the temperature gradient 13.

As the crystallization progress of the silicon melt in the coquille 2 is determined to a significant extent by the dendrites serving as crystallization nuclei, the method according to the invention allows blocks to be reproducibly formed in such a way as to have a predetermined structure, in particular a predetermined grain size distribution and grain orientation distribution, as well as a predetermined shape of the grains and grain boundary structures. The structure of the silicon block, in other words a predetermined grain size distribution and grain orientation distribution, is defined on the side of the silicon block which crystallizes first.

What is claimed is:

1. A device for the production of silicon blocks, the device comprising:
    a vessel for receiving a silicon melt, the vessel comprising a vessel wall comprising at least one side wall, a bottom, an inside and an outside, said vessel further comprising a central longitudinal axis; and
    means for creating a temperature field on the inside of the bottom which temperature field has a temperature gradient which temperature gradient, when the silicon melt cools down, is perpendicular to the central longitudinal axis at least in some regions of the bottom of the vessel, said means for creating the temperature field on the inside of the bottom comprising an insulation unit for insulating the vessel by means of at least a first bottom insulation element and a second bottom insulation element, said first bottom insulation element comprising at least one region having a heat conductivity that differs from a heat conductivity in a region of said second bottom insulation element.

2. A device according to claim 1, wherein the vessel wall comprises at least two regions of different heat conductivity.

3. A device according to claim 1, wherein the bottom comprises at least two different materials whose contribution to a thickness of the bottom varies in the direction perpendicular to the central longitudinal axis.

4. A device according to claim 1, wherein the bottom comprises at least two regions in which the bottom has a different thickness.

5. A device according to claim 1, further comprising an insulation unit for insulating the vessel by means of one of a bottom insulation element and a side insulation element.

6. A device according to claim 5, wherein at least two side insulation elements are provided, with the first side insulation element comprising at least one region with a heat conductivity which differs from the heat conductivity in a region of the second side insulation element.

7. A device according to claim 5, wherein at least one of the insulation elements is displaceable relative to the vessel.

8. A device according to claim 1, further comprising at least one active temperature control unit comprising at least one temperature control element for creating an inhomogeneous temperature field at the bottom of the vessel.

9. A device according to claim 8, wherein the at least one temperature control element comprises one of at least one bottom heating element and at least one side heating element.

10. A device according to claim 8, wherein the at least one temperature control element comprises one of at least one bottom cooling element and at least one side cooling element.

11. A device according to claim 9, wherein the at least one temperature control element is arranged relative to the vessel in such a way as to be changeable in position.

12. A method for the production of silicon blocks, the method comprising the following steps:
    providing a device comprising a vessel for receiving a silicon melt, the vessel comprising a vessel wall having a bottom, said device further comprising a means for creating a temperature field on an inside of the bottom, said means for creating the temperature field on the inside of the bottom comprising an insulation unit comprising at least two bottom insulation elements for insulating the vessel, one of said insulation bottom elements comprising at least one region with a heat conductivity which differs from a heat conductivity in a region of another one of said two bottom insulation elements;
    providing a silicon melt in the vessel; and
    creating an inhomogeneous temperature field at the bottom of the vessel when the silicon melt crystallizes.

13. A device according to claim 1, wherein said first bottom insulation element is adjacent to said second bottom insulation element.

14. A device according to claim 1, wherein at least a portion of said first bottom insulation element and at least a portion of said second bottom insulation element are in direct contact with said bottom.

15. A device according to claim 14, wherein said first bottom insulation element and said second bottom insulation element extend in a direction parallel to said bottom.

16. A method according to claim 12, wherein said one of said at least two bottom insulation elements is located adjacent to said another one of said at least two bottom insulation elements.

17. A method according to claim 16, wherein at least a portion of said one of said at least two bottom insulation elements and at least a portion of said another one of said at least two bottom insulation elements are in direct contact with said bottom.

18. A method according to claim 17, wherein said one of said at least two bottom insulation elements and said another one of said at least two bottom insulation elements extend in a direction parallel to said bottom, said temperature field having a temperature gradient, said temperature gradient being perpendicular to a central longitudinal axis of the vessel at least in some regions of the bottom of the vessel.

* * * * *